(12) United States Patent
Matsuo et al.

(10) Patent No.: US 7,675,291 B2
(45) Date of Patent: Mar. 9, 2010

(54) METHOD AND DEVICE FOR MONITORING DETERIORATION OF BATTERY

(75) Inventors: Hidehito Matsuo, Owariasahi (JP); Tetsuro Kobayashi, Seto (JP); Yuichi Itou, Toyota (JP); Yasuhito Kondo, Toyoake (JP); Yoshio Ukyo, Seto (JP); Yoshiaki Kikuchi, Toyota (JP); Motoyoshi Okumura, Chiryu (JP)

(73) Assignees: Toyota Jidosha Kabushiki Kaisha, Toyota-shi (JP); Kabushiki Kaisha Toyota Chuo Kenkyusho, Aichi-gun (JP)

( * ) Notice: Subject to any disclaimer, the term of this patent is extended or adjusted under 35 U.S.C. 154(b) by 476 days.

(21) Appl. No.: 10/569,210

(22) PCT Filed: Aug. 18, 2004

(86) PCT No.: PCT/IB2004/002687
§ 371 (c)(1),
(2), (4) Date: Feb. 23, 2006

(87) PCT Pub. No.: WO2005/019850
PCT Pub. Date: Mar. 3, 2005

(65) Prior Publication Data
US 2006/0238168 A1    Oct. 26, 2006

(30) Foreign Application Priority Data
Aug. 25, 2003   (JP)   ............... 2003-300289

(51) Int. Cl.
*G01N 27/416* (2006.01)
(52) U.S. Cl. ...................................... 324/426; 324/433

(58) Field of Classification Search ................. 429/426, 429/427, 429, 430, 432–435; 320/132
See application file for complete search history.

(56) References Cited

U.S. PATENT DOCUMENTS 5,543,245 A    8/1996   Andrieu et al.

(Continued)

FOREIGN PATENT DOCUMENTS

EP    0 887 654 A2    12/1998

(Continued)

OTHER PUBLICATIONS

International Search Report, Jan. 12, 2005.

(Continued)

*Primary Examiner*—Edward Tso
*Assistant Examiner*—Ramy Ramadan
(74) *Attorney, Agent, or Firm*—Kenyon & Kenyon LLP

(57) ABSTRACT

A battery characteristic detecting method according to the invention includes a first step in which constant current discharge from a battery is performed at a predetermined current value, and a voltage during constant current discharge is measured; a second step in which overpotential for mass transfer control in the battery or resistance for the mass transfer control in the battery is calculated based on the voltage measured in the first step; and a third step in which a determination that a characteristic change has occurred in the battery is made, when the overpotential for the mass transfer control in the battery or the resistance for the mass transfer control in the battery calculated in the second step is larger than a predetermined threshold value.

7 Claims, 4 Drawing Sheets

U.S. PATENT DOCUMENTS 5,698,962 A * 12/1997 Sakai et al. .................. 324/431
5,994,877 A * 11/1999 Seri et al. .................... 320/132

FOREIGN PATENT DOCUMENTS

| JP | 05-281309 A | | 10/1993 |
|----|----|----|----|
| JP | 07014613 A | * | 1/1995 |
| JP | 08-222279 A | | 8/1996 |
| JP | 08-313606 A | | 11/1996 |
| JP | 08-336202 A | | 12/1996 |
| JP | 09-113588 A | | 5/1997 |
| JP | 10-319100 A | | 12/1998 |
| JP | 2000-121710 A | | 4/2000 |
| JP | 2001-314041 A | | 11/2001 |
| JP | 2002-042895 A | | 2/2002 |
| JP | 2003-009408 A | | 1/2003 |

OTHER PUBLICATIONS

Written Opinion of International Searching Authority, Jan. 12, 2005.
International Preliminary Report on Patentability.

* cited by examiner

METHOD AND DEVICE FOR MONITORING DETERIORATION OF BATTERY

This is a 371 national phase application of PCT/IB2004/002687 filed 18 Aug. 2004, claiming priority to Japanese Patent Application No. JP 2003-300289 filed 25 Aug. 2003, the contents of which are incorporated herein by reference.

BACKGROUND OF THE INVENTION

1. Field of the Invention

The invention relates to a battery characteristic detecting method and a battery characteristic detecting device.

2. Description of the Related Art

If a characteristic change, e.g., a memory effect and degradation, occurs in a battery serving as an electric power source, the ability of the battery is limited. It is therefore important to detect a characteristic change in the battery. For example, Japanese Patent Laid-Open Publication No. 2002-42895 discloses a method for detecting internal resistance in a battery, and detecting whether a memory effect or degradation has occurred in the battery based on the internal resistance. In this method, linear regression of current/voltage characteristics, which are obtained when the battery is being charged/discharged, is performed, and the internal resistance is obtained based on the gradient of the line.

Another method for accurately and easily detecting a degraded condition and estimation of capacity of a sealed lead-acid battery is known from JP 8-222279 A. In this method, an internal resistance of a sealed lead-acid battery is detected and a voltage $\Delta V$ in a difference between the variation in the discharge voltage, the variation indicating a difference between the discharge voltage before discharging and the discharge voltage when a prescribed time has elapsed since the start of the discharge, and the product of internal resistance and the prescribed electric current are found. A present battery capacity is estimated from the correlative relationship between the internal resistance and battery capacity in the voltage variation $\Delta V$.

From EP 0 887 654 A2, methods for detecting a working condition of non-aqueous electrolyte secondary batteries are known, which allow easy and accurate determination of the degree of the degradation and remaining capacity of a non-aqueous electrolyte secondary battery by a simple test irrespective of the past charging and discharging history of the battery. In these methods, the degree of degradation of battery is quantitatively determined on the basis of the voltage value in charging or discharging at a constant current, or from an equation with that voltage value as variable.

From JP 2000-121710, a battery control device for back up power supply and a method for diagnosing the deterioration of a secondary battery are known, wherein a battery pack is connected to an equipment body and drives the equipment body with the output of an assembly battery. A battery voltage detection means detects the output voltage of the assembly battery and a single battery for composing it.

Also, a temperature detection means detects the temperature of the assembly battery in the single battery for composing it by a thermistor. A control part operates a charge control means based on information that is detected by a voltage detection means and a temperature detection means and further sends a control signal to the equipment body via a communication means. The control part reports the obtained information to the user of equipment by a reporting means as needed. As the reporting means, for example, a liquid crystal display for displaying information and an LSD, a speaker for generating an alarm sound, and a vibrator for generating vibration are used.

Still another method for detecting a battery pack condition is known from JP 09-113588, wherein this method includes the steps of measuring impedance by a pack battery as a whole when electricity is conducted to the entire battery pack in which a plurality of single batteries are connected to one another in series, determining the life end of the pack battery when this impedance indicates prescribed impedance or higher set on the basis of a reference which is set by using the case that one single battery is in a deteriorated state and all the remaining single batteries are in brand new states in which the capacity of the pack battery is lowest against the identical impedance in a relationship between the previously obtained impedance of the pack battery and a capacity range and determining the normal condition of the pack battery when this impedance is within the prescribed impedance.

JP 5-281 309 A discloses another method and device for detecting deterioration of a lead battery. According to the device of JP 5-281 309 A, a resistor is connected to a sealed lead battery through a switch. When the battery is made to discharge by closing the switch by $\leq 1$ msec. Then, by measuring the difference between the battery voltage before discharge and the battery voltage in a stable state after the discharge and utilizing a strong correlation between the voltage difference and the battery capacity, the capacity of the battery is found from the voltage difference and, when the capacity is lower than a prescribed value, it is determined that the battery is deteriorated. Since the testing time is set at 1 msec, no spark due to the completion of discharge is generated and the safety can be improved even when a tester is disconnected from the battery by mistake.

Under normal use of the battery, however, there are not many chances that a large current flows when the battery is being charged/discharged. Therefore, according to the above-mentioned method, when data is collected in a short time only a small amount of data concerning a region, where a large current flows when the battery is being charged/discharged, can be obtained. Accordingly, the obtainable data are likely to be concentrated around the origin point (the point at which a voltage is "0V" and a current value is "0A"). If linear regression is performed using the data concentrated around the origin point, an internal resistance value cannot be obtained with high accuracy. As a result, it is difficult to detect a memory effect accurately.

SUMMARY OF THE INVENTION

It is an object of the invention to solve the above-mentioned problems, and to provide a battery characteristic detecting method and a battery characteristic detecting device, capable of accurately detecting a characteristic change in a battery. The detecting method includes the following steps of: (i) performing constant current discharge from a battery at a predetermined current value, and measuring a voltage during the constant current discharge; (ii) calculating overpotential for mass transfer control in the battery or resistance for mass transfer control in the battery based on the measured voltage; and (iii) determining that a characteristic change has occurred in the battery, when the calculated overpotential for the mass transfer control in the battery or resistance for the mass transfer control in the battery is larger than a predetermined threshold value.

In the invention, "overpotential for mass transfer control" signifies overpotential due to an mass transfer speed in the battery from among the entire overpotential in the battery, and "resistance for mass transfer control" signifies resistance due to the mass transfer speed in the battery from among the entire internal resistance in the battery. The inventors have found out the following correlation between the mass transfer speed and the characteristic change. When a characteristic change, e.g., a memory effect and a voltage drop due to long-term disuse of the battery, has occurred in the battery, the mass transfer speed decreases. When the characteristic change disappears, the mass transfer speed returns to the original speed. If the mass transfer speed in the battery decreases, overpotential and resistance due to the mass transfer speed increases. Accordingly, based on the above-mentioned findings, a characteristic change in the battery can be detected by detecting overpotential and resistance for the mass transfer control in the battery.

According to the above-mentioned detecting method, from among the entire overpotential and the resistance in the battery, the overpotential and the resistance for the mass transfer control, which have a particularly high correlation with the characteristic change, are used as references for determining whether a characteristic change has occurred. It is therefore possible to detect a characteristic change accurately.

In the embodiment, the term "constant current discharge" includes not only discharge of electric power at a completely constant current value but also discharge of electric power at a substantially constant current value within a deviation of ±5%.

In the above-mentioned detecting method, in step (i), constant current discharge may be performed by connecting a predetermined load resistance to the battery. In this detecting method, by connecting the predetermined load resistance to the battery, constant current discharge from the battery can be performed using a circuit having a simple configuration.

In the above-mentioned detecting method, in step (i), a first voltage ($E_1$) immediately after a start of the constant current discharge from the battery and a second voltage ($E_2$) when a predetermined time has elapsed since the start of the constant current discharge may be measured. Then, in step (ii), overpotential (E) for the mass transfer control may be calculated based on the first voltage and the second voltage measured in step (i) according to an equation: $E=E_1-E_2$.

In the above-mentioned detecting method, in step (i), a first voltage ($E_1$) and a first current ($I_1$) immediately after a start of constant current discharge from the battery, and a second voltage ($E_2$) and a second current ($I_2$) after a predetermined time has elapsed since the start of constant current discharge may be measured. Then, in step (ii), resistance (R) for the mass transfer control may be calculated based on the first voltage and the second voltage, and the first current and the second current obtained in step (i) according to an equation: $R=E_1/I_1-E_2/I_2$.

Various methods for obtaining overpotential for the mass transfer control and resistance for the mass transfer control are known. According to these methods, however, the measurement needs a long time. The inventors have found out that the value of the overpotential E for the mass transfer control or the value of the resistance R for the mass transfer control, which is calculated in a simplified manner according to one of the above-mentioned equations, can be sufficiently used as a reference for determining whether a characteristic change has occurred in the battery. In addition, the inventors have found out that, according to one of the above-mentioned equations, the accuracy of the value E and the value R is sufficient as a reference for determining whether a characteristic change has occurred, even if the "predetermined time" is set to a smaller value. According to the above-mentioned detecting method, the time for measuring the necessary data can be set to a smaller value, and a characteristic change in the battery can be detected in a short time.

In the above-mentioned detecting method, in step (iii), it may be determined that a memory effect as a characteristic change has occurred in the battery, when the overpotential for the mass transfer control or the resistance for the mass transfer control, which is calculated in step (ii), is larger than the predetermined threshold value. According to this detecting method, a memory effect can be detected using the overpotential for the mass transfer control or the resistance for the mass transfer control as a reference.

In the above-mentioned detecting method, the predetermined current value may be a current value at which a current density in the battery is 5 to 90% of a current density at which a relationship between overpotential of a cathode and a logarithm of the current density in the battery where a characteristic change has not occurred changes between a linear relationship and a non-linear relationship.

If the current value becomes lower than the lower limit of this range, a voltage value cannot be obtained with high accuracy. On the other hand, if the current value becomes higher than the upper limit of the range, a voltage value cannot be obtained with high accuracy when a battery, which has been used for a long time (a battery whose characteristics have been changed with time), is used.

According to the above-mentioned detecting method, by setting the current value during the constant current discharge to a value within the above-mentioned range, it is possible to perform detection of the overpotential for the mass transfer control and the resistance for the mass transfer control, which has good reproducibility It is also possible to accurately detect a characteristic change in the battery for a long time.

In the above-mentioned detecting method, the overpotential for mass transfer control may be calculated by using a voltage in the battery, which is obtained 10 to 90 seconds after the start of constant current discharge to determine whether the characteristic change has occurred in the battery.

A battery characteristic detecting device includes a measuring portion which discharges a battery at a predetermined constant current value and which measures a voltage during the constant current discharge; a calculating portion which calculates overpotential for mass transfer control in the battery or resistance for the mass transfer control in the battery based on the measured voltage; and a determining portion which determines that a characteristic change has occurred in the battery when the calculated overpotential for the mass transfer control or resistance for the mass transfer control is larger than a predetermined threshold value.

With the above-mentioned detecting device, a characteristic change can be detected accurately, since the overpotential and the resistance for the mass transfer control, which have a particularly high correlation with a characteristic change from among the entire overpotential and resistance in the battery, are used as a reference for determining whether a characteristic change has occurred.

BRIEF DESCRIPTION OF THE DRAWINGS

The above mentioned embodiment and other embodiments, objects, features, advantages, technical and industrial significance of this invention will be better understood by reading the following detailed description of the exemplary embodiments of the invention, when considered in connection with the accompanying drawings, in which.

DETAILED DESCRIPTION OF THE PREFERRED EMBODIMENTS

Figure 1:
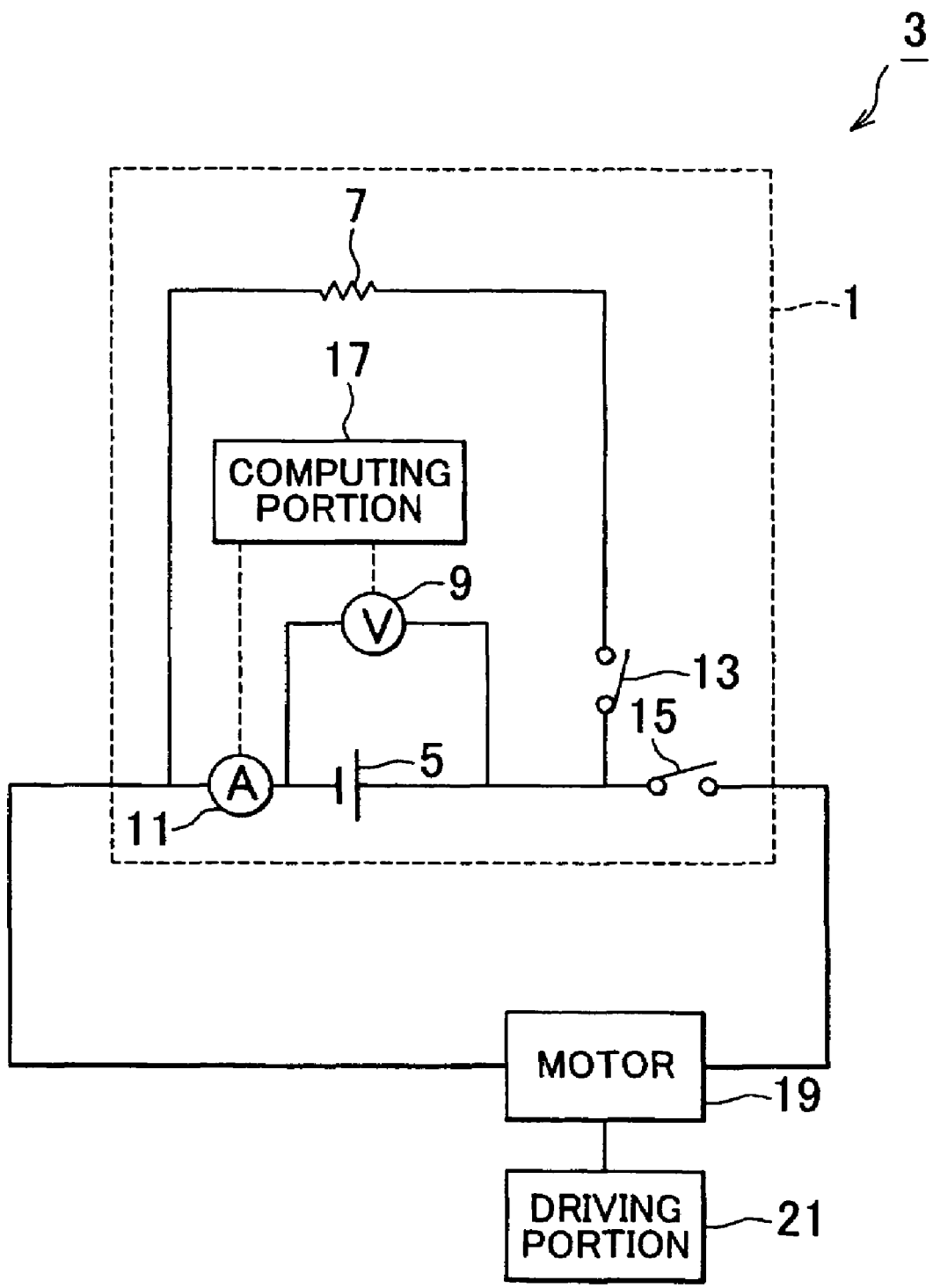
FIG. 1 is a circuit diagram showing a circuit including a battery characteristic detecting device for performing a battery characteristic detecting method.

In the following description, the present invention will be described in more detail in terms of exemplary embodiments.

Note that the same reference numerals are used for the same elements, and overlapping description is not made.

FIG. 1 shows a circuit 3 which is an example of a circuit including a battery characteristic detecting device 1 for performing a battery characteristic detecting method according to the embodiment. In the embodiment, the battery characteristic detecting device 1 is a device which is mounted in an automobile having a battery serving as a energy source, e.g., an electric vehicle and a hybrid vehicle, and which detects a memory effect that occurs in the battery. The battery characteristic detecting device 1 includes a battery 5; a load resistance 7 which applies a load to the battery 5; a voltage detecting portion 9 which measures a voltage in the battery 5; a current detecting portion 11 which measures a current in the battery 5; a changing-over switch 13; a changing-over switch 15; and a computing portion 17 which performs computation based on the measured current/voltage.

The battery 5 is a secondary battery, and can be charged/discharged. As the battery 5, a nickel hydride battery in which nickel hydroxide is used for the cathode, a nickel cadmium battery or the like can be used. Under normal use of the automobile (when the automobile is running), the change-over switch 15 is closed, and the change-over switch 13 is open. When the automobile accelerates, the battery 5 serves as an electric power supply source for a motor 19. A driving portion 21 e.g., a shaft and a tire, is driven by the motor 19 to which electric power is supplied from the battery 5. On the other hand, when the automobile decelerates, the motor 19 serves as a power generator. At this time, the motor 19 is driven by the driving portion 21, electric power is generated by the motor 19, and the generated electric power is stored in the battery 5. The voltage and the current in the battery are constantly measured by the voltage detecting portion 9 and the current detecting portion 11, respectively. The measured voltage and current are converted into electric signals by the voltage detecting portion 9 and the current detecting portion 11, respectively, and transmitted to the computing portion 17.

When characteristics of the battery 5 are detected, the change-over switch 15 is opened, and the change-over switch 13 is closed. At this time, electric power is discharged from the battery 5 to the load resistance 7 at a substantially constant current value (constant current discharge is performed). Also in this case, a voltage and a current in the battery are measured by the voltage detecting portion 9 and the current detecting portion 11, respectively, as in the case where the battery is used normally. The measured voltage and current are converted into electric signals by the voltage detecting portion 9 and the current detecting portion 11, respectively, and transmitted to the computing portion 17. The time at which characteristics of the battery 5 are detected is not particularly limited as long as electric power need not be supplied to the motor 19. For example, characteristics may be detected when the automobile is started. Also, characteristics may be detected while the hybrid vehicle is driven using only an internal combustion engine.

The computing portion 17 converts the received electric signals into a voltage value and a current value, stores a voltage and a current at each time, and recognizes changes with time in the current/voltage. The computing portion 17 calculates overpotential for the mass transfer control in the battery 5 based on the above-mentioned changes with time, and determines whether a memory effect has occurred in the battery 5 based on whether the calculated overpotential for the mass transfer control is larger than a threshold value stored in advance.

A resistance value of the load resistance 7 is set in the following manner, such that a current during the constant current discharge has a current density at which detection of the overpotential for the mass transfer control, that has good reproducibility, can be performed.

Figure 2:
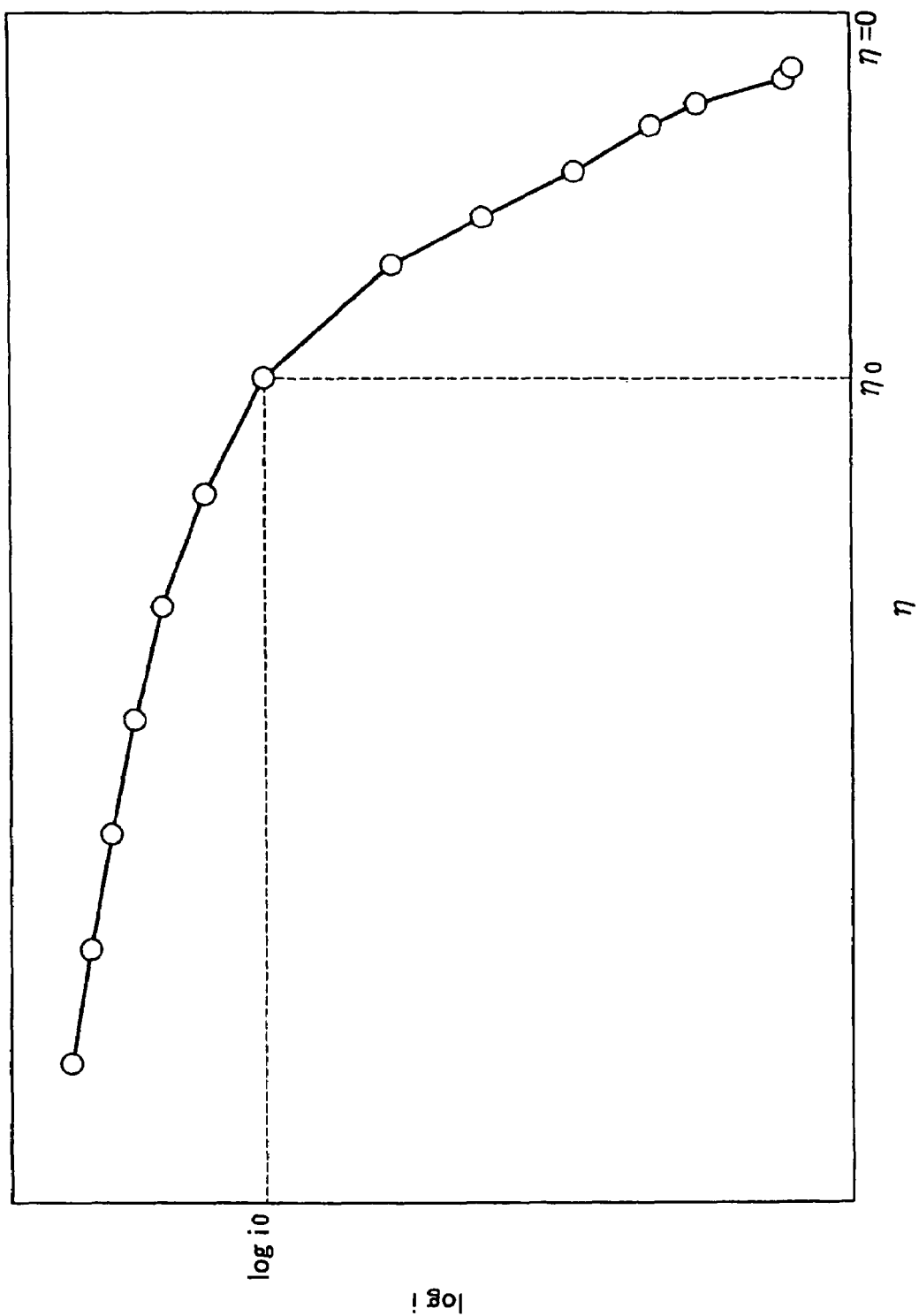
FIG. 2 is a graph showing a overpotential curve of a reference battery.

First, with regard to the same type of battery as the battery 5, a current-overpotential curve is prepared in a direction in which the cathode is reduced when a memory effect has not occurred. In this case, the overpotential curve is a curve showing a relationship between overpotential "$\eta$" and a logarithm "log i" of the current density, in the case where the overpotential is shown by "$\eta$", and the current density is shown by "i". The overpotential curve may be prepared in a known method. For example, a three-electrode-cell is prepared using the cathode of the battery (reference battery) in which a memory effect has not occurred. Then, the relationship between the overpotential "$\eta$" and the current density "i" can be obtained by polarizing a predetermined value "$\eta$" from an appropriate open circuit voltage, and measuring a response current at this time, using a potentiostat, a function generator, a-recorder, or the like. FIG. 2 shows an example of the overpotential curve prepared in this case. In the graph in FIG. 2, the horizontal axis shows the overpotential "$\eta$", and the vertical axis shows the logarithm "log i" of the current density. The unit of the overpotential "$\eta$" is shown by, for example, "mV", and the unit of the current density "i" is shown by, for example, "mA/cm$^2$".

As shown in FIG. 2, in the region where the value of "log i" is equal to or smaller than "log $i_0$" (the region where "$\eta$" is equal to or larger than "$\eta_0$"), the overpotential "$\eta$" and the logarithm "log i" of the current density is in the substantially linear relationship. However, in the region where "log i" is larger than "log $i_0$" (the region where "$\eta$" is smaller than "$\eta_0$"), the overpotential "$\eta$" and the logarithm "log i" deviates from the linear relationship. Namely, FIG. 2 shows that the current density at which the relationship between the overpotential "$\eta$" of the cathode of the reference battery and the logarithm "log i" of the current density changes between the linear relationship and a non-linear relationship is "$i_0$". Based on the obtained "$i_0$", the resistance value for making the current density "$i_s$" during constant current discharge 5 to 90% of "$i_0$", preferably 50 to 70% of "$i_0$" is set to a resistance value "r" of the load resistance 7. The unit of the resistance value "r" is shown by, for example, "m$\Omega$".

Figure 3:
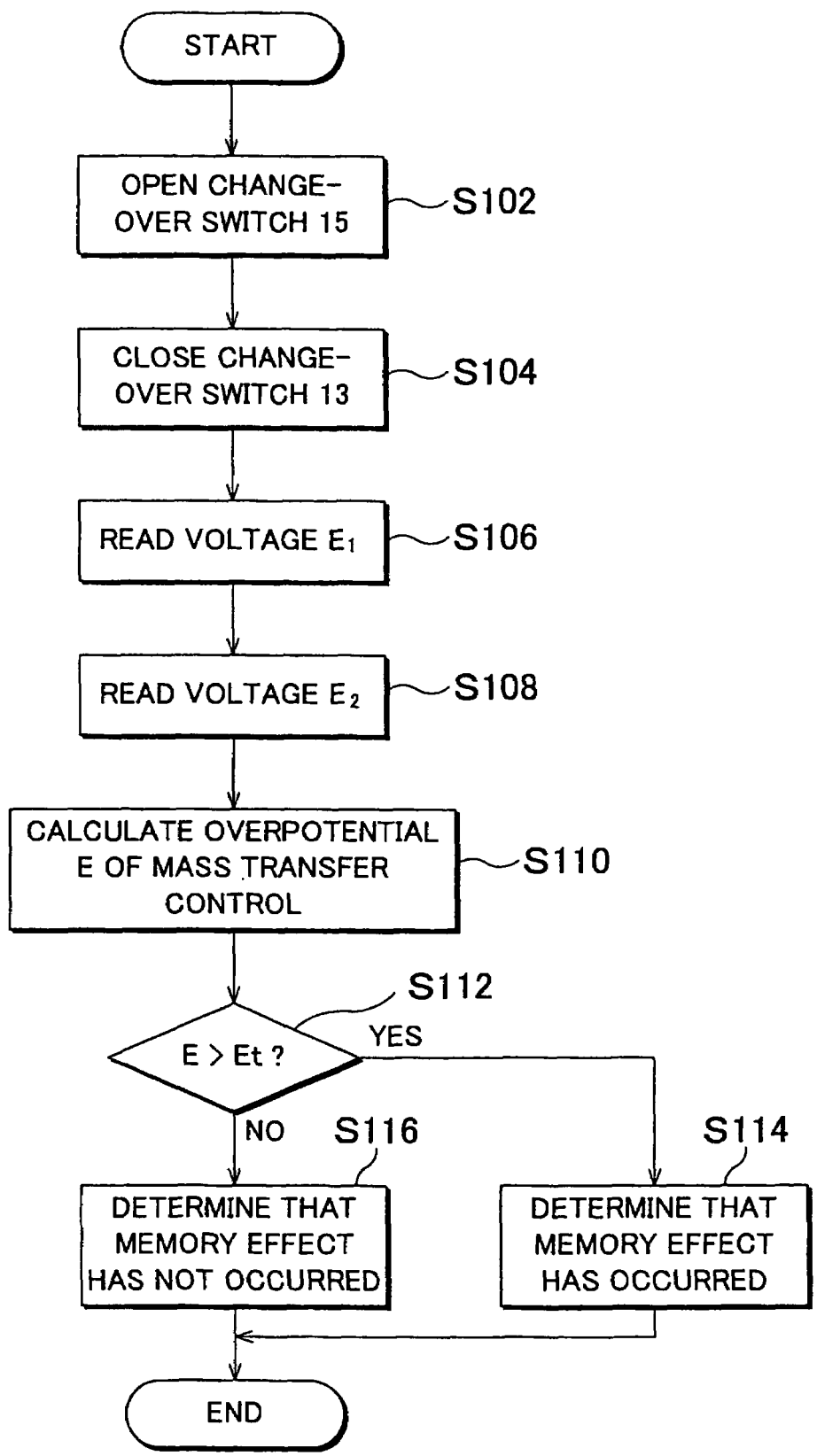
FIG. 3 is a flowchart showing a routine of the battery characteristic detecting method.

A battery characteristic detecting method for detecting a memory effect in the battery 5 will be described with reference to FIG. 1 and FIG. 3. FIG. 3 is a flowchart showing a routine of the battery characteristic detecting method.

First, the change-over switch 15 is opened in step S102. Approximately one second after this, the change-over switch 13 is closed, and a closed circuit is formed between the battery 5 and the load resistance 7 in step S104. Since the resistance value "r" of the load resistance 7 is set in the above-mentioned manner, the constant current discharge from the battery 5 is started at a current value at which the current density become "$i_s$", and a current flows through the closed circuit. The current flowing through the closed circuit is detected by the current detecting portion 11, and transmitted to the computing portion 17 as an electric signal. Also, the voltage of the battery 5 is detected by the voltage detecting portion 9, and transmitted to the computing portion 17 as an electric signal.

Figure 4:
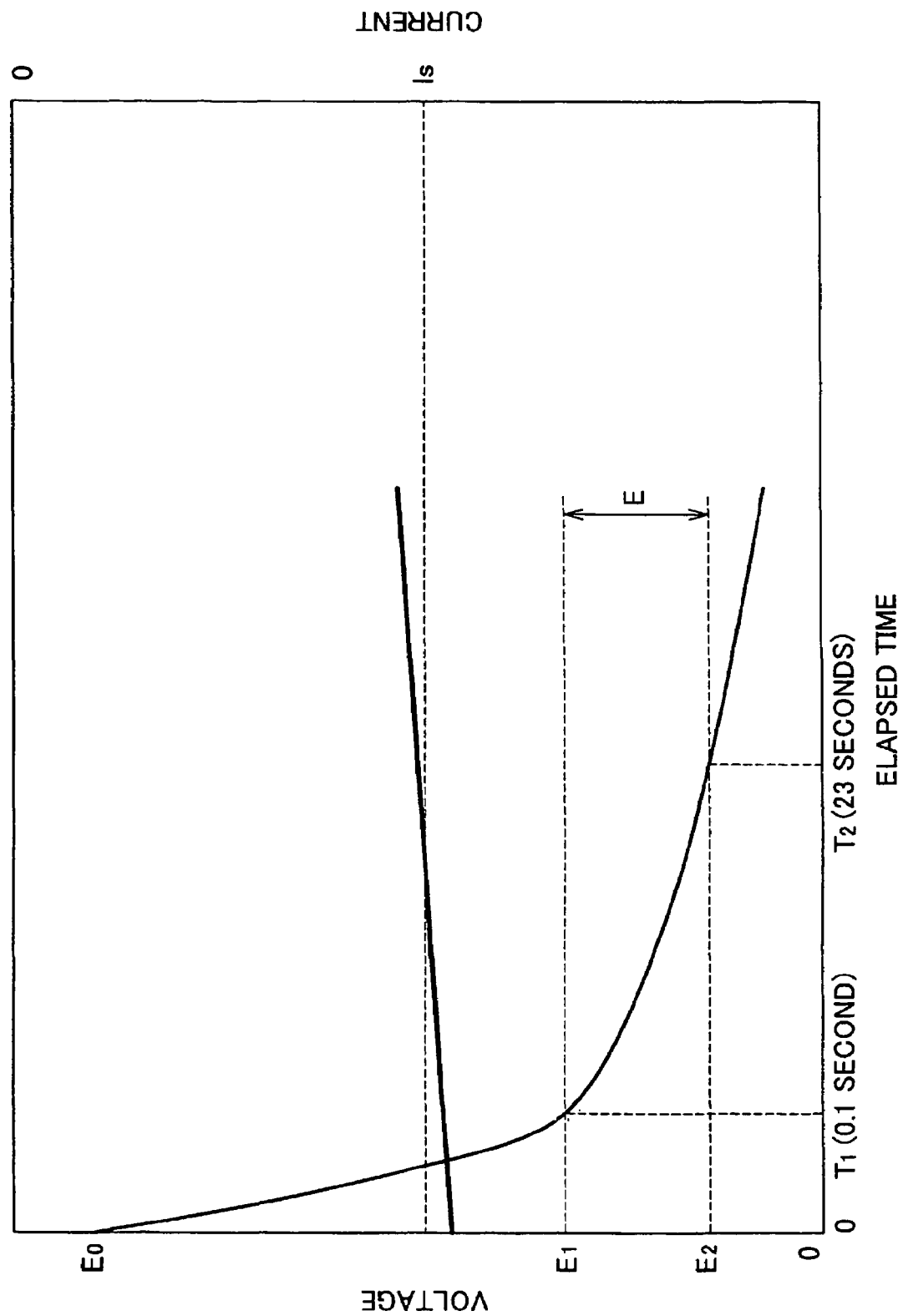
FIG. 4 is a graph showing changes in current/voltage from when discharge from the battery is started.

The computing portion 17 receives electric signals corresponding to voltage/current at each time. FIG. 4 shows an example of changes with time in the voltage/current. FIG. 4 is a graph showing changes in the voltage/current at each time using the time when the discharge is started, that is, the time when the change-over switch 13 is closed as "0" (t="0"). In the graph, the horizontal axis shows the elapsed time "t" (the unit is second), the right vertical axis shows the current at each time, and the left vertical axis show the voltage at each time. In FIG. 4, the thin curve shows the change in the voltage, and the heavy curve shows the change in the current. The scale of the graph is modified as required for the purpose of explanation. As shown in the graph in FIG. 4, from when the change-over switch 15 is opened until when the change-over switch 13 is closed, the voltage of the battery 5 is the open-circuit voltage $E_0$ of the battery 5. Then, at the moment at which the change-over switch 13 is closed, a voltage drop and the like occurs due to connection of the load resistance 7 to the battery 5. Then, the voltage drops with time. Meanwhile, after the change-over switch 13 is closed, the current is substantially constant and is maintained at $I_s$, and constant current discharge from the battery 5 is performed.

The computing portion 17 reads the voltage $E_1$ immediately after discharge is started ($t_1$ seconds after the change-over switch 13 is closed) in step S106. Next, in step S108, the computing portion 17 reads the voltage $E_2$ $t_2$ seconds after discharge is started. The overpotential E for the mass transfer control is calculated according to the following equation in step S110.

$$E = E_1 - E_2 \ldots \quad (1)$$

In the embodiment, $t_1$ is set to 0.1 second, and $t_2$ is set to 23 seconds.

The computing portion 17 compares the calculated overpotential E for the mass transfer control with the threshold value Et in step S112. When the overpotential E is larger than the threshold value Et, it is determined in step S114 that a memory effect has occurred in the battery 5. On the other hand, when the overpotential E is not larger than the threshold value Et, it is determined in step S116 that a memory effect has not occurred in the battery 5. The threshold value Et is set in advance, and stored in the computing portion 17. The routine of the battery characteristic detecting method thus ends.

Causes of a voltage drop in the battery can be classified into three, that are, resistance due to IR loss, reaction resistance, and resistance due to mass transfer. It is considered that a voltage drop caused by resistance due to IR loss or response resistance substantially ends approximately 0.1 second after resistance is applied to the battery. Accordingly, it can be considered that a voltage drop 0.1 second after the start of the discharge and thereafter is caused by the resistance due to the mass transfer. Therefore, by detecting a voltage drop 0.1 second after the start of the discharge and thereafter, overpotential for the mass transfer control can be obtained. In order to read the voltage after a voltage drop caused by the resistance due to IR loss or the reaction resistance substantially ends as the voltage $E_1$, time $t_1$ is set to 0.1 second in the embodiment. Namely, the voltage/current immediately after the start of the discharge signify the voltage/current time $t_1$ (0.1 second, in the embodiment) after the start of the discharge.

In view of improving the accuracy of calculating overpotential for mass transfer control, the longer time $t_2$ is, the better. However, in view of performing determination in a short time, the shorter time $t_2$ is, the better. In order to perform determination in a short time while maintaining the accuracy at which whether a memory effect has occurred in the battery 5 can be determined, it is preferable that time $t_2$ be set to a value in a range of 10 to 90 seconds. It is further preferable that time $t_2$ be set to a value in a range of 20 to 40 seconds. In the embodiment, time $t_2$ is set to 23 seconds.

In the above-mentioned battery characteristic detecting method, the overpotential E for the mass transfer control in the battery 5 is obtained, and compared with the threshold value. The fact that the overpotential E for the mass transfer control in the battery 5 becomes larger than the threshold value signifies that the mass transfer speed in the battery 5 becomes lower than the predetermined value. The inventors have confirmed the fact that there is a high correlation between a decrease in the mass transfer speed in the battery 5 and occurrence of a memory effect in the battery 5. Therefore, according to the above-mentioned battery characteristic detecting method, from among the entire overpotential in the battery, the overpotential E for the mass transfer control in the battery 5, which has a particularly high correlation with a memory effect, is obtained, and whether a memory effect has occurred is determined. It is therefore possible to detect a memory effect accurately.

Also, in the above-mentioned battery characteristic detecting method, the load resistance 7 is connected to the battery 5 in the first step. Therefore, constant current discharge from the battery 5 can be performed using a circuit having a simple configuration.

In the above-mentioned battery characteristic detecting method, the overpotential E for the mass transfer control in the battery 5 is calculated based on the relationship in the equation (1). The voltages $E_1$ and $E_2$ which are necessary data for the equation (1) are measurement values obtained in a short time (23 seconds, in the embodiment) after the constant current discharge is started. Therefore, according to the above-mentioned battery characteristic detecting method, it is possible to determine whether a memory effect has occurred in the battery 5 in a short time.

In the above-mentioned battery characteristic detecting method, by setting the current density during constant current discharge from the battery 5 to a value within the above-mentioned range, it is possible to perform detection of the overpotential for the mass transfer control, which has good reproducibility. It is therefore possible to accurately detect a characteristic change in the battery for a long time.

The invention is not limited to the above-mentioned embodiment, and the invention may be realized in various other embodiments within the scope of the invention.

For example, in the above-mentioned embodiment, the overpotential for the mass transfer control is obtained according to the equation (1). However, the resistance for the mass transfer control in the battery 5 may be calculated based on the relationship between the voltage obtained by the voltage detecting device 9 and the current obtained by the current detecting device 11. In this case, in the second step, the computing portion 17 reads the current $I_1$/voltage $E_1$ "$t_1$" seconds after the start of discharge, and current $I_2$/voltage $E_2$ "$t_2$" seconds after the start of discharge. Then, in the third step, resistance R for the mass transfer control is calculated based on the relationship in the following equation.

$$R = E_1/I_1 - E_2/I_2 \ldots \quad (2)$$

The computing portion 17 compares the resistance R for the mass transfer control with the threshold value Rt. When the resistance R is larger than the threshold value Rt, it is determined that a memory effect has occurred in the battery 5. On the other hand, when the resistance R is not larger than the threshold value Rt, it is determined that a memory effect has not occurred in the battery 5. The threshold value Rt is set in advance, and stored in the computing portion 17. Thus, it is possible to perform detection of a characteristic change, which has good reproducibility, even when the battery is used for a long time, and a current/voltage characteristics have changed.

In the above-mentioned embodiment, constant current discharge is performed by connecting the load resistance 7 to the battery 5. However, constant current discharge may be performed by connecting a constant current circuit or the like to the battery 5.

In the above-mentioned embodiment, a memory effect in the battery 5 is detected. However, the invention can be applied to the case where another characteristic change having correlation with the mass transfer speed in the battery 5 is detected. An example of the other characteristic change is a voltage drop due to long-term disuse of the battery.

While the invention has been described with reference to exemplary embodiments thereof, it is to be understood that the invention is not limited to the exemplary embodiments or constructions. To the contrary, the invention is intended to cover various modifications and equivalent arrangements. In addition, while the various elements of the exemplary embodiments are shown in various combinations and configurations, which are exemplary, other combinations and configurations, including more, less or only a single element, are also within the spirit and scope of the invention.

The invention claimed is:

1. A battery characteristic detecting method for a battery of an electric or hybrid vehicle, comprising:
   (i) mounting the battery in an electric or hybrid vehicle;
   (ii) performing constant current discharge from a battery that is not fully charged at a predetermined current value, and measuring a voltage in the battery during the constant current discharge, wherein the predetermined current value is selected as follows:
      in the battery where a characteristic change has not occurred, determining a relationship between overpotential of a cathode and a logarithm of the current density in the battery,
      determining a select current density at which the overpotential of the cathode and the logarithm of the current density in the battery changes between a linear relationship and a non-linear relationship, and
      selecting the predetermined current value to be a current value at which the current density in the battery is 5 to 90% of the select current density;
   (iii) calculating overpotential for mass transfer control in the battery based on the measured voltage; and
   (iv) determining that a characteristic change has occurred in the battery, when the calculated overpotential for the mass transfer control in the battery is larger than a predetermined threshold value,
   wherein, in step (ii), both a first voltage, E1, in the battery immediately after a staff of the constant current discharge from the battery, and a second voltage, E2, in the battery when a predetermined time has elapsed since the staff of the constant current discharge, are measured during the constant current discharge, and, in step (iii), overpotential, E, for the mass transfer control is calculated based on the first voltage and the second voltage measured in step (ii) according to a following equation:

$$E = E1 - E2.$$

2. The battery characteristic detecting method according to claim 1, wherein the constant current discharge is performed by connecting a predetermined load resistance to the battery in step (ii).

3. The battery characteristic detecting method according to claim 1, wherein, in step (iv), it is determined that a memory effect as the characteristic change has occurred in the battery, when the overpotential for the mass transfer control which is calculated in step (ii), is larger than the predetermined threshold value.

4. The battery characteristic detecting method according to claim 2, wherein, in step (iv), it is determined that a memory effect as the characteristic change has occurred in the battery, when the overpotential for the mass transfer control which is calculated in step (ii), is larger than the predetermined threshold value.

5. The battery characteristic detecting method according to claim 1, wherein the overpotential for mass transfer control is calculated by using a voltage in the battery, which is obtained 10 to 90 seconds after the start of constant current discharge to determine whether the characteristic change has occurred in the battery.

6. The battery characteristic detecting method according to claim 2, wherein the overpotential for mass transfer control is calculated by using a voltage in the battery, which is obtained 10 to 90 seconds after the start of constant current discharge to determine whether the characteristic change has occurred in the battery.

7. A battery characteristic detecting device, comprising:
   a measuring portion which discharges a battery that is not fully charged at a predetermined constant current value and which measures a voltage during the constant current discharge;
   a calculating portion which calculates overpotential for mass transfer control in the battery based on the measured voltage; and
   a determining portion which determines that a characteristic change has occurred in the battery when the calculated overpotential for the mass transfer control is larger than a predetermined threshold value,
   wherein the measuring portion, during the constant current discharge, measures both a first voltage, E1, in the battery immediately after a start of the constant current discharge from the battery, and a second voltage, E2, in the battery when a predetermined time has elapsed since the start of the constant current discharge,
   wherein overpotential, E, for the mass transfer control is calculated based on the first voltage and the second voltage measured by the measuring portion according to the following equation:

$$E = E1 - E2,$$

and wherein the predetermined current value is selected as follows:
      in the battery where a characteristic change has not occurred, determining a relationship between overpotential of a cathode and a logarithm of the current density in the battery,
      determining a select current density at which the overpotential of the cathode and the logarithm of the current density in the battery changes between a linear relationship and a non-linear relationship, and
      selecting the predetermined current value to be a current value at which the current density in the battery is 5 to 90% of the select current density.

* * * * *